United States Patent

Nirschl et al.

(10) Patent No.: US 6,221,683 B1
(45) Date of Patent: Apr. 24, 2001

(54) METHOD FOR PRODUCING A LIGHT-EMITTING COMPONENT

(75) Inventors: Ernst Nirschl, Wenzenbach; Olaf Schönfeld, Regensburg, both of (DE)

(73) Assignee: Osram Opto Semiconductor GmbH & Co. OHG, Regensburg (DE)

( * ) Notice: Subject to any disclaimer, the term of this patent is extended or adjusted under 35 U.S.C. 154(b) by 0 days.

(21) Appl. No.: 09/450,398

(22) Filed: Nov. 29, 1999

Related U.S. Application Data

(63) Continuation of application No. PCT/DE98/01412, filed on May 27, 1998.

(30) Foreign Application Priority Data

May 27, 1997 (DE) ............................................. 197 22 156

(51) Int. Cl.[7] .................................................. H01L 21/00
(52) U.S. Cl. ............................... 438/47; 438/46; 438/23; 438/22
(58) Field of Search .................... 438/47, 46, 22, 438/23, 28

(56) References Cited

U.S. PATENT DOCUMENTS 3,931,631  1/1976  Groves et al. ........................ 357/17
5,300,788 * 4/1994 Fan et al. .............................. 257/13

FOREIGN PATENT DOCUMENTS

| 0 616 376 A1 | 9/1924 | (EP) . |
| 0 420 691 A2 | 4/1991 | (EP) . |
| 5-251739 | 9/1993 | (JP) . |

* cited by examiner

Primary Examiner—Vu A. Le
Assistant Examiner—Brad Smith
(74) Attorney, Agent, or Firm—Herbert L. Lerner; Laurence A. Greenberg; Werner H. Stemer

(57) ABSTRACT

The invention relates to a method for producing a light-emitting component. A sequence of layers including at least one active layer is formed on the front face of a basic substrate consisting of semiconductor material. Subsequently, the basic substrate is at least partially removed and the sequence of layers is connected to an external substrate. The basic substrate is removed by wet-chemical etching in an etching agent that acts selectively on the material of the basic substrate. A first metallic contact layer is then applied to an end surface of the sequence of layers, and a second metallic contact layer is applied to an end surface of the external substrate. The sequence of layers is connected to the external substrate by connecting the first metallic contact layer to the second metallic contact layer using heat, by means of eutectic bonding.

9 Claims, 1 Drawing Sheet

US 6,221,683 B1

METHOD FOR PRODUCING A LIGHT-EMITTING COMPONENT

CROSS-REFERENCE TO RELATED APPLICATION

This is a continuation of copending International Application PCT/DE98/01412, filed May 27, 1998, which designated the United States.

BACKGROUND OF THE INVENTION

Field of the Invention

The invention relates, in general to a method for producing a light-emitting component, and in particular, to a method for producing a light-emitting component, in which, after the formation of a layer sequence including at least one active layer on the front side of a semiconductor base substrate, the base substrate is at least partially removed and the layer sequence is subsequently joined to a foreign substrate.

Light-emitting semiconductor components are produced on the basis of III–V semiconductor systems in which a light-emitting layer sequence including an active layer is deposited epitaxially on a semiconductor base substrate made of GaAs, for example. The active layer is, for example, InGaAlP with different Al concentrations. For diverse applications, it is necessary that the epitaxially applied layer sequence be removed from the base substrate (so-called epitaxial lift-off) and be fixed on a different carrier (foreign substrate) with the formation of good electrical contacts. Depending on the desired application and the fabrication technology used, the problems that have to be solved when producing individual components are different from the problems that have to be solved when producing monolithic integrated circuits. A significant part of the visible light emitted by the semiconductor chip is absorbed by the base substrate (for example GaAs), as a result of which the external efficiency of light generation becomes minimal. A substrate (for example GaP) which is transparent to the emitted light is thus preferred in order to achieve extremely high light intensities typically of 5 lm or more, and efficiencies typically of more than 10%. At the same time, there is a desire to provide good electrical coupling between the epitaxial layer sequence and the foreign substrate even when high currents are used (with a minimal total forward voltage of the LED semiconductor chip), and to provide a high yield during production. Typical applications for such individual semiconductor components are exterior lighting, lamps, and the like in motor vehicles. Furthermore, it is possible to realize optoelectronic integrated circuits by implementating extremely small III–V semiconducting epitaxial layers in silicon-based integrated circuits. In this case, the electrical coupling of the III–V semiconductor component to the silicon component is crucial.

Typical examples of applications for these are LED displays, optical information processing systems, and the like.

The fabrication, fixing and electrical contact-making of an epitaxial layer on a foreign substrate have to date been carried out essentially by two methods known as heteroepitaxy and fusion of epitaxial layers on fine substrates.

In the case of the heteroepitaxy for example of InGaAlP on GaP, high dislocation densities are inevitably produced because of the large lattice mismatches of the materials used. The dislocation densities can be reduced either by reducing the epitaxial areas using SiO2 masks, thereby enabling strain to be relieved more easily, or by conventional methods such as, for example, thermally cyclic crystal growth, introduction of interfaces and the like. Nevertheless, the high density of dislocations leads to intensification of non-radiating recombination processes and thus to reduced light emission, as well as to undefined additive voltage drops across the chip, which is unfavorable for the electrical coupling.

In the case of the fusion of epitaxial layers on foreign substrates, the absorbing GaAs base substrate is removed wet-chemically from the epitaxial layer sequence by selective undercutting, an AlN layer having been introduced beforehand. The remaining epitaxial layer sequence is applied to a transparent GaP foreign substrate under high pressure and at high temperature. The epitaxial layer sequence adheres on the transparent foreign substrate by way of the formation of van der Waals bonds.

All of the production methods discussed present the disadvantage of having undefined junctions between the two bodies to be joined, which are essentially caused because of an inhomogeneous etching away of the absorbing substrate over a few hundred micrometers. The inhomogeneous van der Waals bonds between the epitaxial layer sequence and the foreign substrate and the associated formation of oxides can lead to unfavorably high voltage drops across the semiconductor chip and can considerably reduce the yield. Thus, in the case of commercially available LED semiconductor components for high-current applications in which the InGaAlP layer sequence was joined by fusion on a GaP foreign substrate, forward voltages of 2.4 mV and above were measured at 70 mA, which greatly limits their application.

Published European Patent Application EP 0 616 376 A1 discloses a method for wafer bonding of LED layers, wherein the LED layers are produced on a growth substrate which is subsequently removed. The LED layers are joined in a planar manner to a second substrate of suitable optical properties using a conventional wafer bonding technique in order to obtain a low contact resistance or desired optical interface properties with the second substrate.

Published Japanese Patent Application JP-A 5 251 739 discloses a light-emitting semiconductor device which provides for a red GaAsP-LED and a green GaP-LED to be electrically contact-connected in order to produce a mixed color. A eutectic alloy is provided for electrically contact-connecting the two LEDs to one another.

SUMMARY OF THE INVENTION

It is accordingly an object of the invention to provide a method for producing a light-emitting component which overcomes the hereinafore-mentioned disadvantages of the heretofore-known methods of this general type that enables an improved electrical junction between an epitaxial layer sequence and a foreign substrate. In particular it is an object to provide an improved electrical junction that can withstand high electrical currents, and to increase the yield of fabricated LED semiconductor chips by providing defined electrical junctions. The light-emitting component is preferably employed in optoelectronics and automobile electronics.

A metal film having a thickness of a few nanometers could be vapor deposited on an epitaxial layer sequence that has been separated from a base substrate. The epitaxial layer sequence could subsequently be applied to a transparent or absorbing foreign substrate that is likewise provided with a thin metal film. Alloying would then take place at the metal junction with heat treatment. The epitaxial layer sequence would adhere to the foreign substrate by way of the alloy.

With the foregoing and other objects in view there is provided, in accordance with the invention, a method for producing a light-emitting component, that includes: forming a sequence of layers on a base substrate in which the sequence of layers includes at least one active layer; at least partially removing the base substrate from the sequence of layers; patterning a metallic contact layer, defining a first contact layer, on a surface of the sequence of layers; patterning a metallic contact layer, defining a second contact layer, on a surface of a foreign substrate; providing at least one solder layer between the first contact layer and the second contact layer; and joining the sequence of layers to the foreign substrate only by eutectically bonding the first contact layer to the second contact layer.

In accordance with an added feature of the invention, the base substrate is preferably removed by wet-chemical etching in an etchant which is selective for the material of the base substrate.

In accordance with an additional feature of the invention, the wet-chemical etching of the base substrate is preceded by mechanical thinning of the base substrate. This makes it possible to achieve a highly homogeneous separation of the base substrate from the layer sequence containing the active layer.

Compared with the methods used heretofore, the method according to the invention principally has the advantage that defined, electrically conductive junctions are produced between the epitaxially grown layer sequence and the foreign substrate. The defined electrically conductive junctions occur because of a combination of effects caused by a defined substrate etching of the base substrate, which has only a minimal thickness, and by eutectic bonding of the selfsupporting layer sequence onto a preferably transparent foreign substrate. It is particularly advantageous, if the base substrate has a small total thickness of at most approximately 100 $\mu$m so that such a defined substrate etching can be achieved.

In accordance with another feature of the invention, when thicker base substrates are used, wet-chemical etching of the base substrate is preceded by a mechanical thinning of the base substrate to the advantageous total thickness typically of 100 $\mu$m. This enables homogeneous dissolution of the base substrate to be effected by etching even for wafer diameters of two inches or more.

In accordance with a further feature of the invention, for eutectic bonding of the first and second contact layers, a solder layer containing gold is advantageously used. The solder layer is applied in a patterned manner either on the first or second contact layer, or on both. The solder layer is melted when the two contact layers are joined together, preferably by a laser soldering, and solders the two parts together during subsequent cooling at the junction. The eutectic solder advantageously adheres only to those points on the patterned metallization layers that are provided for it. As a result, it is possible to produce a defined metallic junction between the two subcomponents, thereby resulting in favorable component properties even in the case of high electric currents and, at the same time, resulting in high yields during production of the component.

Other features which are considered as characteristic for the invention are set forth in the appended claims.

Although the invention is illustrated and described herein as embodied in a method for producing a light-emitting component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
FIG. 1 shows a schematic cross section through a layer sequence that has been deposited epitaxially on a base substrate.

Referring now to the figures of the drawings in detail, there is seen a light-emitting component produced by the method according to the present invention. The light-emitting component includes a semiconductor base substrate 1 made of GaAs on which there is applied an epitaxially deposited layer sequence which, proceeding from the semiconductor substrate 1, has a first cladding layer 2, an active layer 3 and a second cladding layer 4. The active layer 3 according to the exemplary embodiment as shown in FIG. 1 constitutes an InGaAlP double heterostructure with the emitted radiation having a wavelength typically of at most 800 nm. Alternatively, the active layer may be formed by a homo-pn junction. A coupling-out layer 5 made of GaP with a thickness typically of 10 mm to approximately 50 mm is deposited above the second cladding layer 4 and serves to improve the optical coupling-out efficiency of the light radiated by the light emitting diode. The arrangement and function of the layer sequence comprising the individual layers 2, 3, 4, 5 in light emitting diodes used as light sources, in particular, as transmitting elements in optical telecommunications are known in the art, and therefore need not be explained in any further detail here. Depending on the desired wavelength of the emitted light, use can be made of different semiconductor systems whose respective underlying semiconductor materials also entail different production methods each having independent technological problems. In the visible spectral region with wavelengths from approximately 400 to 800 nm, use is made of an AlGaInP alloy system, on which the illustrated exemplary embodiment is based. The desired wavelength can be determined from a relatively wide color range by setting the aluminum content. In principle, however, the method according to the invention can also be used to produce light emitting diodes with larger wavelengths in the infrared region, which are as a rule based on an AlGaAs system, in which wavelengths of the emitted light of above approximately 800 nm can be achieved by setting the aluminum content in the typical range from approximately 10% to 30%.

The base substrate 1 made of GaAs may initially have a total thickness typically of several hundred micrometers. To apply the method in this situation, it is necessary to mechanically thin the base substrate 1, preferably by grinding, during which the total thickness of the base substrate 1 is set to approximately 100 mm. The situation after the grinding process is illustrated in FIG. 1. The semiconductor wafer is subsequently immersed in an etchant that is selective for the material of the base substrate 1. In the case of GaAs, the etchant used may be, for example, a solution comprising $H_2O:NH_3:H_2O_2$ in the ratio of 4:2:1. After approximately 45 min, the base substrate 1 has completely dissolved, while the layer sequence comprising the layers 2, 3, 4, 5 has not been attacked. The GaAs base substrate 1 is dissolved in an extremely homogeneous manner in this case because its thickness is minimal. It is readily possible to obtain separated layer sequences with wafer thickness of two inches or more.

Figure 2:
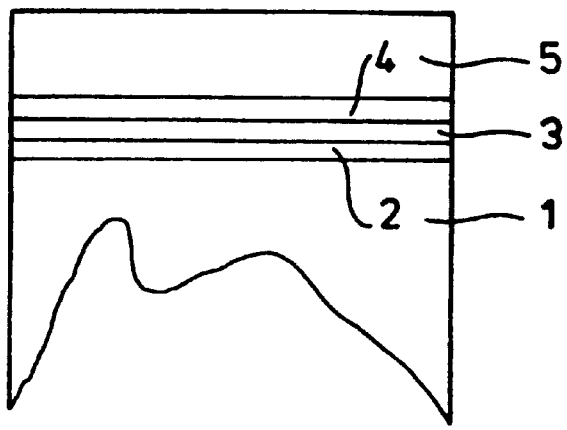
FIG. 2 shows a schematic cross section after the etching of a comparatively thick base substrate.

FIG. 2 shows the case of a GaAs base substrate 1 which has a thickness of several hundred µm that has been wet-chemically etched without being mechanically thinned beforehand. An irregular etching attack is discernable here, which ultimately leads to an inhomogeneous junction between the layer sequence 2, 3, 4, 5 and the transparent foreign substrate that is subsequently to be joined. Therefore, it is preferable to perform a mechanical grinding process before etching when using relatively thick base substrates 1.

Figure 3:
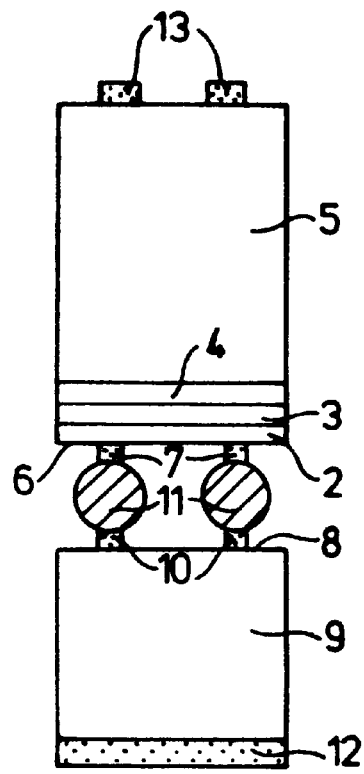
FIG. 3 shows a schematic illustration of a light-emitting component, produced according to the invention, with the layer sequence eutectically bonded on the foreign substrate.

FIG. 3 schematically shows the fixing and electrical contact-making of the wet-chemically separated epitaxial layer sequence 2, 3, 4, 5 on a foreign substrate carrier 9. For this purpose, an n-type contact layer 7 covered with a thin layer of gold is applied in a patterned manner on the rear side 6 of the separated layer sequence (n-side). A patterned n-type contact layer 10 (in the case of an n-doped GaP foreign substrate 9) or a different metallization layer (for example for foreign substrates made of glass or silicon), whose surface is covered with a thin AuSn layer as a eutectic solder, is likewise applied to the front side 8 of the transparent foreign substrate 9. The transparent foreign substrate 9 provided with the metallic contact layer 10 and the layer sequence 2, 3, 4, 5 provided with the metallic contact layer 7 are placed one on top of the other and subjected to heat treatment using a suitable heat source. The AuSn coating on the contact layer 10 melts (represented schematically by the reference symbol 11) and solders the two subcomponents together at the junction during cooling, thereby producing an electrical and mechanical connection, as illustrated schematically in FIG. 3. The rear side contact layer 7 of the epitaxial layer sequence 2, 3, 4, 5 is electrically and mechanically connected to the front side contact layer 10 of the transparent foreign substrate 9. In this case, the eutectic solder 11 adheres only to the metallization layers 7 and 10. A defined metallic junction between the two chip components is thus produced which enables favorable component properties even with high electric currents. The defined metallic junction is precise and enables comparatively high production yields. For the sake of completeness, the reference numerals 12 designate a metallic n-rear side contact-making layer on the foreign substrate 9 and the reference symbol 13 designates a patterned p-contact on the coupling-out layer 5.

We claim:

1. A method for producing a light-emitting component, which comprises:
   providing a base substrate as a wafer with a diameter of at least two inches;
   forming a sequence of layers on the base substrate in which the sequence of layers includes at least one active layer;
   at least partially removing the base substrate from the sequence of layers;
   patterning a metallic contact layer, defining a first contact layer, on a surface of the sequence of layers;
   patterning a metallic contact layer, defining a second contact layer, on a surface of a foreign substrate;
   providing at least one solder layer between the first contact layer and the second contact layer; and
   joining the sequence of layers to the foreign substrate only by eutectically bonding the first contact layer to the second contact layer.

2. The method according to claim 1, which comprises using a solder layer that includes gold as the at least one solder layer.

3. The method according to claim 1, which comprises providing a transparent material as the foreign substrate.

4. The method according to claim 1, which comprises:
   providing the base substrate as a GaAs base substrate;
   providing the active layer with a layer selected from the group consisting of InGaAlP, GaAs, and AlGaAs; and
   performing the step of forming the sequence of layers by epitaxially depositing the sequence of layers on the base substrate.

5. The method according to claim 1, which comprises performing the step of forming the sequence of layers by epitaxially depositing the sequence of layers on the base substrate such that, proceeding from the base substrate, the sequence of layers includes a first cladding layer, an active layer, a second cladding layer, and a coupling-out layer.

6. The method according to claim 1, which comprises producing a plurality of light-emitting components.

7. The method according to claim 1, which comprises:
   fabricating a coupling-out layer on an opposite surface of the sequence of layers, the opposite surface being remote from the surface of the sequence of layers; and
   depositing a patterned metallic electrode layer on the coupling-out layer.

8. The method according to claim 1, wherein the step of at least partially removing the base substrate from the sequence of layers is performed by wet-chemically etching the base substrate using an etchant that is selective for the base substrate.

9. The method according to claim 8, which comprises mechanically thinning the base substrate before performing the step of wet-chemically etching.

* * * * *